(12) United States Patent
Chen et al.

(10) Patent No.: US 12,237,660 B2
(45) Date of Patent: Feb. 25, 2025

(54) LEAKAGE CURRENT DETECTION AND INTERRUPTION DEVICE, ELECTRICAL CONNECTOR AND ELECTRICAL APPLIANCE

(71) Applicant: Chengli Li, Suzhou (CN)

(72) Inventors: Long Chen, Suzhou (CN); Chengli Li, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 267 days.

(21) Appl. No.: 17/934,552

(22) Filed: Sep. 22, 2022

(65) Prior Publication Data

US 2024/0097426 A1 Mar. 21, 2024

(30) Foreign Application Priority Data

Sep. 16, 2022 (CN) .......................... 202211131788.0
Sep. 16, 2022 (CN) .......................... 202222459017.6

(51) Int. Cl.
| | |
|---|---|
| *H02H 3/08* | (2006.01) |
| *G01R 31/52* | (2020.01) |
| *H01H 47/00* | (2006.01) |
| *H01H 47/32* | (2006.01) |
| *H01H 71/24* | (2006.01) |
| *H02H 3/05* | (2006.01) |

(Continued)

(52) U.S. Cl.
CPC .............. *H02H 3/05* (2013.01); *G01R 31/52* (2020.01); *H01H 47/002* (2013.01); *H01H 47/32* (2013.01); *H01H 71/24* (2013.01); *H02H 3/08* (2013.01); *H01R 13/713* (2013.01)

(58) Field of Classification Search
CPC .......... H02H 3/05; H02H 3/08; H01H 47/002; H01H 47/32; H01H 71/24; G01R 31/52
USPC ................................... 361/42, 93.1
See application file for complete search history.

(56) References Cited

U.S. PATENT DOCUMENTS

| | | | | |
|---|---|---|---|---|
| 6,674,289 B2 * | 1/2004 | Macbeth | ................ | H02H 3/335 |
| | | | | 361/45 |
| 6,807,036 B2 * | 10/2004 | Baldwin | ................ | H02H 3/335 |
| | | | | 361/42 |

(Continued)

*Primary Examiner* — Jared Fureman
*Assistant Examiner* — Lucy M Thomas
(74) *Attorney, Agent, or Firm* — Chen Yoshimura LLP

(57) ABSTRACT

A leakage current detection and interruption device includes a switch module configured to control electrical connection between input and output ends of power supply lines; a leakage current detection module configured to generate a leakage fault signal in response to a leakage current in the power supply lines; a leakage-responsive drive module configured to drive the switch module to disconnect the electrical connection in response to the leakage fault signal; a fault-responsive drive module configured to drive the switch module to disconnect the electrical connection in response to a fault in the leakage-responsive drive module; and a self-test module configured to generate a self-test signal and to generate a self-test fault signal in response to a fault in the leakage current detection module and/or the leakage-responsive drive module. By providing the fault-responsive drive module, the device can automatically disconnect the electrical power when the leakage-responsive drive module has a fault.

23 Claims, 6 Drawing Sheets

(51) Int. Cl.
*H02H 9/02* (2006.01)
*H01R 13/713* (2006.01)

(56) References Cited

U.S. PATENT DOCUMENTS

2018/0109102 A1\* 4/2018 Li .......................... H01H 71/24
2021/0265832 A1\* 8/2021 Li .......................... H02H 3/335

\* cited by examiner

LEAKAGE CURRENT DETECTION AND INTERRUPTION DEVICE, ELECTRICAL CONNECTOR AND ELECTRICAL APPLIANCE

BACKGROUND OF THE INVENTION

Field of the Invention

This invention relates to electrical circuits, and in particular, it relates to a leakage current detection and interruption device and related electrical connectors and electrical appliances.

Description of Related Art

Electrical appliance are widely used in homes and industries. For safety, leakage current detection and interruption device are typically installed at output ends of electrical grids or input ends of home appliances. Many current leakage current detection and interruption devices are designed to have both a leakage current detection function and a self-testing function. However, in many such devices with self-testing function, when the trip coil (solenoid) or semiconductor device (e.g. silicon-controlled rectifier, SCR) of the main circuit is faulty, the device does not trip, and can only generate an audible or visible alarm. If the user cannot immediately receive the alarm and become aware of such malfunction and stop using the device, there is still a safety threat.

SUMMARY

Therefore, there is a need for a leakage current detection and interruption device which can interrupt the power connection when the trip coil or semiconductor device of the main circuit is faulty, without manual intervention by the user, and can prevent the device from being reset when there is a component fault, or will repeatedly trip if the user attempts to reset it. These functions enhance the safety of the device.

To solve the above-described problem, embodiments of the present invention provide a leakage current detection and interruption device that can disconnect power connection when there is a fault in its internal component, thereby enhancing safety.

In one aspect, the present invention provides a leakage current detection and interruption device, which includes:
 a switch module configured to control an electrical connection between an input end and an output end of power supply lines;
 a leakage current detection module, configured to detect a leakage current in the power supply lines and to generate a leakage fault signal in response thereto;
 a leakage-responsive drive module, coupled to the leakage current detection module and the switch module, configured to drive the switch module to disconnect the electrical connection between the input and output ends in response to the leakage fault signal;
 a fault-responsive drive module, configured to drive the switch module to disconnect the electrical connection between the input and output ends in response to a fault in the leakage-responsive drive module; and
 a self-test module, coupled to the leakage current detection module and the leakage-responsive drive module, configured to generate a self-test signal, and to generate a self-test fault signal in response to a fault in the leakage current detection module and/or the leakage-responsive drive module.

In one embodiment, the leakage-responsive drive module includes:
 a first solenoid, coupled to the switch module, configured to generate an electromagnetic force to drive the switch module;
 a second semiconductor switch, coupled to the first solenoid, the self-test module and the fault-responsive drive module; and
 a first semiconductor switch, coupled to the leakage current detection module, and to either the second semiconductor switch or the first solenoid.

In one embodiment, in response to a fault in any one of the first solenoid, the first semiconductor switch and the second semiconductor switch, the fault-responsive drive module drives the switch module to disconnect the electrical connection between the input and output ends.

In one embodiment, the fault-responsive drive module includes:
 a second solenoid, coupled to the switch module, configured to generate an electromagnetic force to drive the switch module; and
 a third semiconductor switch, coupled to the second solenoid,
 wherein in response to the fault in the leakage-responsive drive module and/or the leakage current detection module, the third semiconductor switch is configured to become conductive, causing the second solenoid to drive the switch module to disconnect the electrical connection between the input and output ends.

In one embodiment, the fault-responsive drive module includes:
 a third semiconductor switch, coupled to the input end;
 a second solenoid, coupled to the third semiconductor switch and the switch module, configured to generate an electromagnetic force to drive the switch module; and
 wherein in response to the fault in the leakage-responsive drive module and/or the leakage current detection module, the third semiconductor switch is configured to become conductive, causing the second solenoid to drive the switch module to disconnect the electrical connection between the input and output ends.

In one embodiment, the leakage-responsive drive module includes:
 a first solenoid, coupled to the leakage current detection module and the switch module, configured to generate an electromagnetic force to drive the switch module;
 a second semiconductor switch, coupled to the first solenoid, the self-test module and the fault-responsive drive module; and
 a first semiconductor switch, coupled to the second semiconductor switch, the leakage current detection module and the self-test module.

In one embodiment, in the absence of any fault, the second semiconductor switch is non-conductive when the self-test module generates the self-test signal.

In one embodiment, the fault-responsive drive module includes:
 a third semiconductor switch, coupled to the second semiconductor switch;
 wherein in response to a fault in the leakage-responsive drive module or the leakage current detection module, the third semiconductor switch becomes conductive which reduces a current flowing through the first solenoid to below a threshold value, and wherein in response thereto, the switch module disconnects the electrical connection between the input end and the output end.

In one embodiment, the leakage current detection module includes:

a leakage current detection coil, through which the first and second power supply lines pass, wherein the leakage current detection coil is configured to generate a leakage current signal in response to a leakage current on the first or second power supply line; and a leakage current detection unit, coupled to the leakage current detection coil and the leakage-responsive drive module, and configured to receive the leakage current signal and generate a leakage fault signal in response thereto.

In one embodiment, the self-test module is coupled to the leakage current detection coil, wherein the leakage current detection coil is configured to receive the self-test signal and feed it to the leakage current detection unit.

In one embodiment, each of the first, second and third semiconductor switch is a transistor, a metal-oxide-semiconductor field-effect transistor (MOSFET), a silicon-controlled rectifier (SCR), a photocoupler, or a relay.

In one embodiment, the leakage current detection and interruption device further includes:

a first contact switch, coupled between the leakage-responsive drive module and the leakage current detection module, wherein in absence of any fault, the first contact switch is configured to control the leakage-responsive drive module to drive the switch module to connect the electrical connection between the input end and the output end.

In one embodiment, the leakage current detection and interruption device further includes:

a second switch, coupled between the input end of the power supply lines and the leakage-responsive drive module, wherein the leakage-responsive drive module is configured to control the second switch to disconnect the leakage-responsive drive module from the input end of the power supply lines in response to a leakage current on the power supply lines.

In another aspect, the present invention provides an electrical power connection device, which includes a body, and the leakage current detection and interruption device in any of the above embodiments, disposed inside the body.

In another aspect, the present invention provides an electrical appliance which includes an electrical load and an electrical power connection device coupled between a power supply and the load to supply power to the load, wherein the electrical power connection device includes the leakage current detection and interruption device of claim in any of the above embodiments.

BRIEF DESCRIPTION OF THE DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

A main technical problem solved by leakage current detection and interruption devices according to embodiments of the present invention is: How to interrupt power connection when certain electrical components (e.g., solenoid, semiconductor switch) in the device is faulty, without the user's manual intervention, thereby enhancing safety of the device.

To solve the above problem, embodiments of the present invention provide a leakage current detection and interruption device which includes: a switch module configured to control electrical connection between input and output ends of power supply lines; a leakage current detection module configured to generate a leakage fault signal in response to a leakage current in the power supply lines; a leakage-responsive drive module configured to drive the switch module to disconnect the electrical connection in response to the leakage fault signal; a fault-responsive drive module configured to drive the switch module to disconnect the electrical connection in response to a fault in the leakage-responsive drive module; and a self-test module configured to generate a self-test signal and to generate a self-test fault signal in response to a fault in the leakage current detection module and/or the leakage-responsive drive module.

First Embodiment

Figure 1:
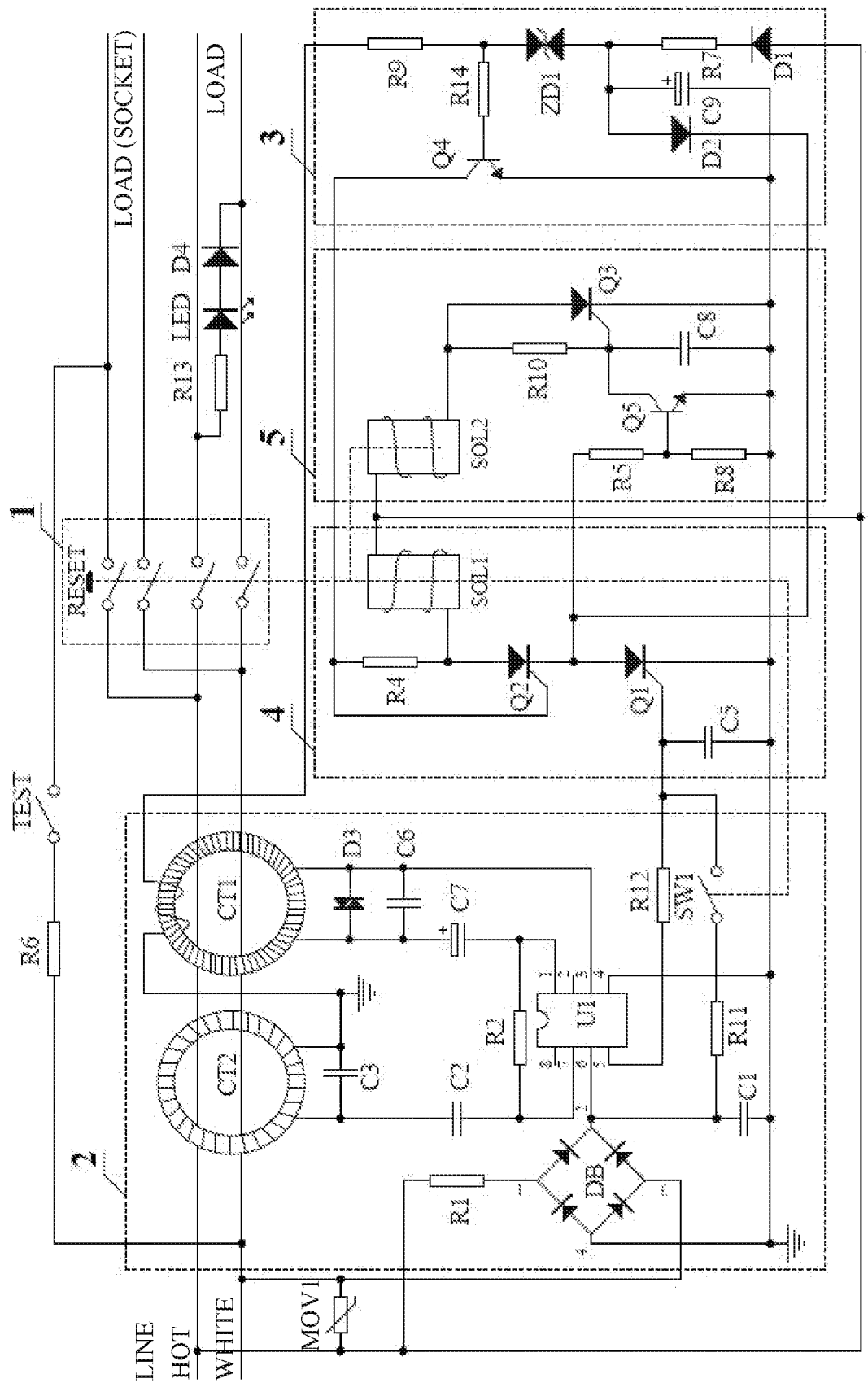
FIG. 1 is a circuit diagram of a leakage current detection and interruption device according to a first embodiment of the present invention.

FIG. 1 is a circuit diagram of a leakage current detection and interruption device according to a first embodiment of the present invention. As shown in FIG. 1, the leakage current detection and interruption device includes a switch module 1, a leakage current detection module 2, a leakage-responsive drive module 4, a fault-responsive drive module 5, a self-test module 3, and a first contact switch SW1.

The power supply lines include hot and white lines. The switch module 1 includes a reset switch RESET coupled between the input end LINE and output end LOAD of the power supply lines, configured to control the electrical connection between the input end and the output end.

The leakage current detection module 2 includes: a neutral detection coil CT2, a leakage current detection coil CT1, a leakage current detection unit (processor chip) U1, a rectifier (diode bridge) DB, and various related resistors and capacitors. The first and second power supply lines (HOT and WHITE) pass through the leakage current detection coil CT1, and the coil CT1 detects any leakage current on the two power supply lines and outputs a signal to the leakage current detection unit U1. The leakage current detection unit U1 generates a leakage fault signal in response thereto. The diode bridge DB is coupled to the first power line HOT, second power line WHITE, the leakage current detection unit U1, and ground.

The leakage-responsive drive module 4 includes: first solenoid SOL1, second semiconductor switch Q2 (e.g., a silicon-controlled rectifier, SCR), first semiconductor switch Q1 (e.g., an SCR), and resistor R4. The first solenoid SOL1 is coupled to the input end LINE (e.g., to the first power supply line HOT), the second semiconductor switch Q2 and the fault-responsive drive module 5. The first solenoid SOL1 is configured to generate an electromagnetic force that drives the reset switch RESET and the first contact switch SW1. In this embodiment, the input end of the second semiconductor switch Q2 is coupled to the first solenoid SOL1, its control electrode is coupled to the self-test module 3, and its output end is coupled to the input end of the first semiconductor switch Q1. The control electrode of the first semiconductor switch Q1 is coupled to the first contact switch SW1 and to an output of the leakage current detection unit U1. Resistor R4 is coupled between the first solenoid SOL1 and the control electrode of the second semiconductor switch Q2.

The fault-responsive drive module 5 includes: a second solenoid SOL2, a third semiconductor switch Q3 (e.g., an SCR), a fourth semiconductor switch Q5 (e.g., a transistor), a capacitor C8, and resistors R5, R8 and R10. The second solenoid SOL2 is coupled to the input end LINE of the power supply lines (e.g., to the first power supply line HOT), the third semiconductor switch Q3, and the leakage-responsive drive module 4. The second solenoid SOL2 is configured to generate an electromagnetic force that drives the reset switch RESET and the first contact switch SW1. In this embodiment, the input end of the third semiconductor switch Q3 is coupled to the second solenoid SOL2, its control electrode is coupled to the collector of the fourth semiconductor switch Q5, and its output end is coupled to the emitter of the fourth semiconductor switch Q5. The base of the fourth semiconductor switch Q5 is coupled between resistors R5 and R8. Capacitor C8 is coupled between the emitter and collector of the fourth semiconductor switch Q5. Resistor R5 is coupled between the input end of the second semiconductor switch Q2 and the base of the fourth semiconductor switch Q5. Resistor R8 is coupled between the base of the fourth semiconductor switch Q5 and the output end of the first semiconductor switch Q1. Resistor R10 is coupled between the second solenoid SOL2 and the control electrode of the third semiconductor switch Q3.

The self-test module 3 includes: a fifth semiconductor switch Q4 (e.g., a transistor), a Zener diode or TVS (Transient Voltage Suppressor) diode ZD1, first diode D1, second diode D2, resistors R14, R9 and R7, and capacitor C9. The input end of the first diode D1 is coupled to input end LINE of the power supply lines (e.g., first power supply line HOT), and its output end is coupled via resistor R7 to both one end of the Zener diode ZD1 and the input end of the second diode D2. The output end of the second diode D2 is coupled between the first semiconductor switch Q1 and the second semiconductor switch Q2. The other end of the Zener diode ZD1 is coupled to resistor R14, and also coupled via resistor R9 to pass through the leakage current detection coil CT1 and then to ground. The base of the fifth semiconductor switch Q4 is coupled via resistor R14 to the other end of the Zener diode ZD1; its emitter is coupled to the output end of the third semiconductor switch Q3; and its collector is coupled to the control electrode of the second semiconductor switch Q2. Capacitor C9 is coupled between one end of the Zener diode ZD1 and the emitter of the fifth semiconductor switch Q4.

The working principles of the leakage current detection and interruption device of this embodiment are as follows.

When the leakage current detection and interruption device is functioning normally, a current flows through the path HOT-SOL1-R4 to trigger the second semiconductor switch Q2 to be conductive. In this state, when the reset switch RESET is depressed by the user, the first contact switch SW1 (which is mechanically linked to the reset switch RESET) is closed, which triggers the first semiconductor switch Q1 to be conductive. As a result, a current flows through the path HOT-SOL1-Q2-Q1-DB to WHITE, causing the first solenoid SOL1 to be energized to generate an electromagnetic force to unlock the reset switch RESET, so that the reset switch RESET is maintained at a closed state. In this state, the input end LINE of the power supply lines is electrically connected to the output end LOAD (which may include an electrical socket SOCKET and/or a directly connected electrical load).

When no leakage current is present on the power supply lines, the leakage current detection unit U1 will not generate a leakage fault signal, so the first semiconductor switch Q1 is non-conductive. Thus, a current flows through the path Q2-R5 to trigger the fourth semiconductor switch Q5 to be conductive. As a result, the control electrode of the third semiconductor switch Q3 is at a low voltage, i.e., the third semiconductor switch Q3 is non-conductive. Because the first semiconductor switch Q1 and third semiconductor switch Q3 are non-conductive, the first solenoid SOL1 and second solenoid SOL2 do not have a sufficiently high current through them, so that the reset switch RESET remains closed (i.e. not tripped).

During the self-testing of the device, a current flows through the path HOT-D1-R7 to charge capacitor C9. When the voltage across capacitor C9 reaches the trigger voltage of the Zener diode ZD1, the Zener diode ZD1 becomes conductive, causing a current to flow through R9-CT1 to ground to generate a self-test signal (a simulated leakage current). The self-test signal is collected by the leakage current detection coil CT1 and processed by the leakage current detection unit U1 to generate a leakage current fault signal, which triggers the first semiconductor switch Q1 to become conductive. While the Zener diode ZD1 is conductive, the fifth semiconductor switch Q4 is triggered via resistor R14 to be conductive, so that the control electrode of the second semiconductor switch Q2 is at a low voltage. In other words, while the first semiconductor switch Q1 is conductive, the second semiconductor switch Q2 is non-conductive, so no current flows through the first solenoid SOL1. In this state, capacitor C9 is discharged via D2-Q1, so the Zener diode ZD1 stops, causing the second semiconductor switch Q2 to become conductive again after the first semiconductor switch Q1 becomes non-conductive.

When the second semiconductor switch Q2 is non-conductive, no current flows through resistor R5, so the fourth semiconductor switch Q5 is non-conductive. In this state, resistor R10 charges capacitor C8. In this embodiment, the parameters of resistor R10 and capacitor C8 are adjusted so that the third semiconductor switch Q3 only becomes conductive after a predetermined time period T1, but the second semiconductor switch Q2 becomes conductive again within the predetermined time period T1. Thus, after the second semiconductor switch Q2 becomes conductive again, the fourth semiconductor switch Q5 is triggered via R5 to be conductive again. As a result, capacitor C8 is discharged, and the control electrode of the third semiconductor switch Q3 is at a low voltage, so the third semiconductor switch Q3 remains non-conductive. In other words, in the self-test process after the self-test module 3 generates the self-test signal, there is never a sufficiently large current that flows through the first solenoid SOL1 and second solenoid SOL2, so the reset switch RESET remains closed.

On the other hand, after the self-test module 3 generates the self-test signal, if the leakage current detection coil CT1 or the leakage current detection unit U1 has a fault, then the leakage current detection module 2 cannot generate a leakage current fault signal, so the first semiconductor switch Q1 remains non-conductive. Thus, when the first semiconductor switch Q1 remains non-conductive, or when the first semiconductor switch Q1 itself has an open-circuit fault, capacitor C9 cannot be discharged, so the Zener diode ZD1 remains triggered and conductive for a time period longer than the predetermined time period T1, causing the fifth semiconductor switch Q4 becomes conductive. This in turn causes the second semiconductor switch Q2 and the fourth semiconductor switch Q5 to be non-conductive. Thus, resistor R10 continuously charges capacitor C8, and after the predetermined time period T1, the voltage across capacitor C8 triggers the third semiconductor switch Q3 to become conductive. As a result, a current flows through the path HOT-SOL2-Q3-DB to WHITE, which energizes the second solenoid SOL2 to drive the reset switch RESET to trip and to disconnect the power supply from the input end LINE to the output end LOAD.

Further, when the first solenoid SOL1 or second semiconductor switch Q2 has an open-circuit fault, no current flows through resistor R5, so the fourth semiconductor switch Q5 remains non-conductive. Thus, a current through resistor R10 continuously charges capacitor C8, and after the predetermined time period T1, the voltage across capacitor C8 triggers the third semiconductor switch Q3 to become conductive. As a result, a current flows through second solenoid SOL2, which energizes the second solenoid SOL2 to drive the reset switch RESET to trip and to disconnect the power supply from the input end LINE to the output end LOAD.

In other words, when the leakage current detection module 2 or leakage-responsive drive module 4 has a fault, the leakage current detection module 2 generates a self-test fault signal (voltage at the input end of fifth semiconductor switch Q4) to cause the second semiconductor switch Q2 to be non-conductive. When this condition continues for a time period longer than the predetermined time period T1, the third semiconductor switch Q3 is triggered to conduct, so the fault-responsive drive module 5 drives the reset switch RESET to trip, thereby disconnecting the power supply from the input end LINE to the output end LOAD.

The leakage current detection and interruption device according to the first embodiment can effectively detect leakage current and perform self-test, and can also effectively disconnect power to the output end when a fault condition is present in the leakage current detection module 2 (e.g., the leakage current detection coil CT1 and/or leakage current detection unit U1 therein) or the leakage-responsive drive module 4 (e.g., the first solenoid SOL1, first semiconductor switch Q1, and/or second semiconductor switch Q2 therein). This enhances the functions of the device and ensures safety of the user.

Second Embodiment

Figure 2:
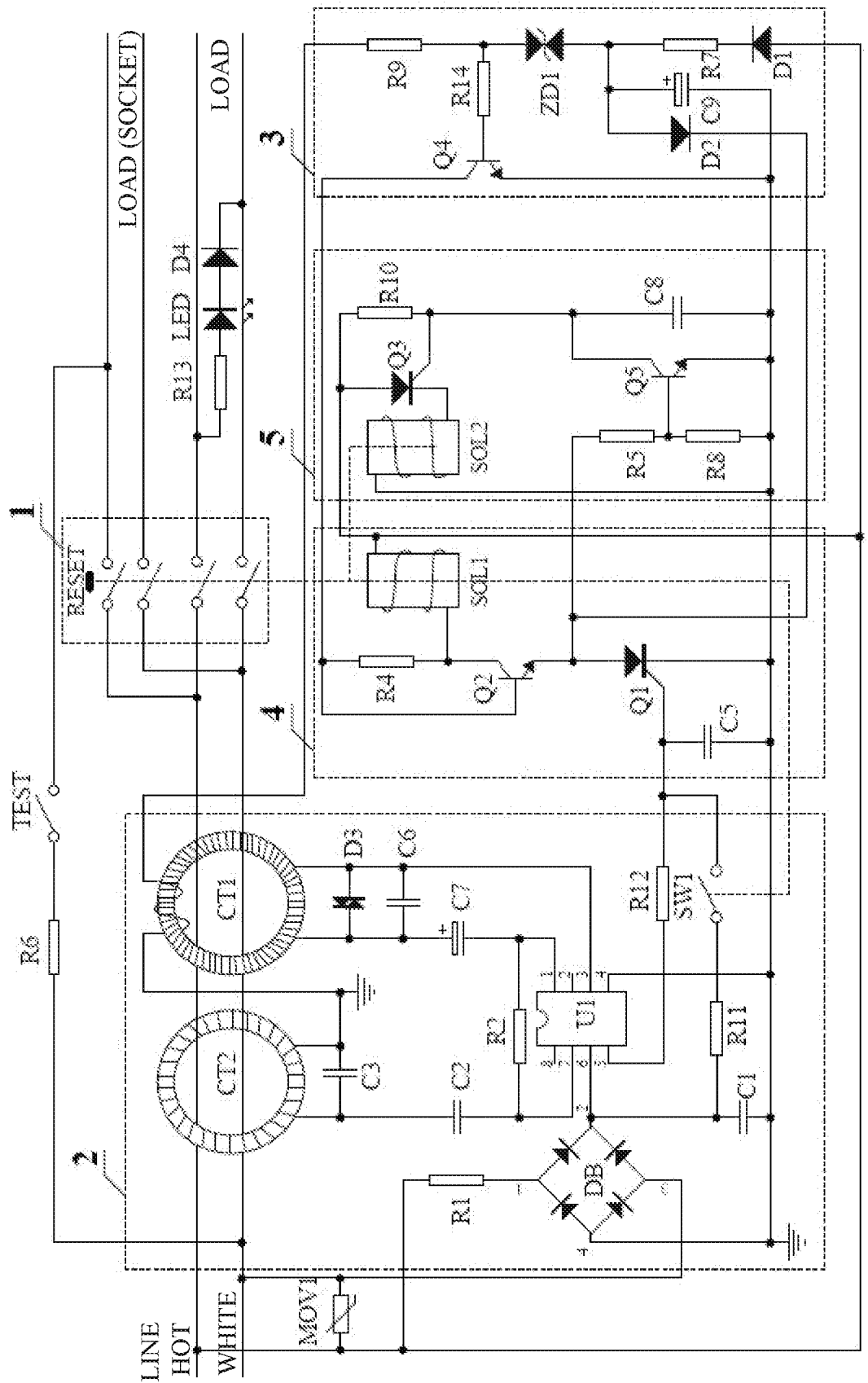
FIG. 2 is a circuit diagram of a leakage current detection and interruption device according to a second embodiment of the present invention.

FIG. 2 is a circuit diagram of a leakage current detection and interruption device according to a second embodiment of the present invention. Compared to the first embodiment of FIG. 1, a main difference is that the third semiconductor switch Q3 (e.g., an SCR) in FIG. 2 has its input end coupled to the input end LINE of the power supply lines, and its output end coupled to the second solenoid SOL2. Further, in the embodiment of FIG. 2, the second semiconductor switch Q2 is a transistor. The working principles of the second embodiment are similar to those of the first embodiment and detailed descriptions are omitted here.

Third Embodiment

Figure 3:
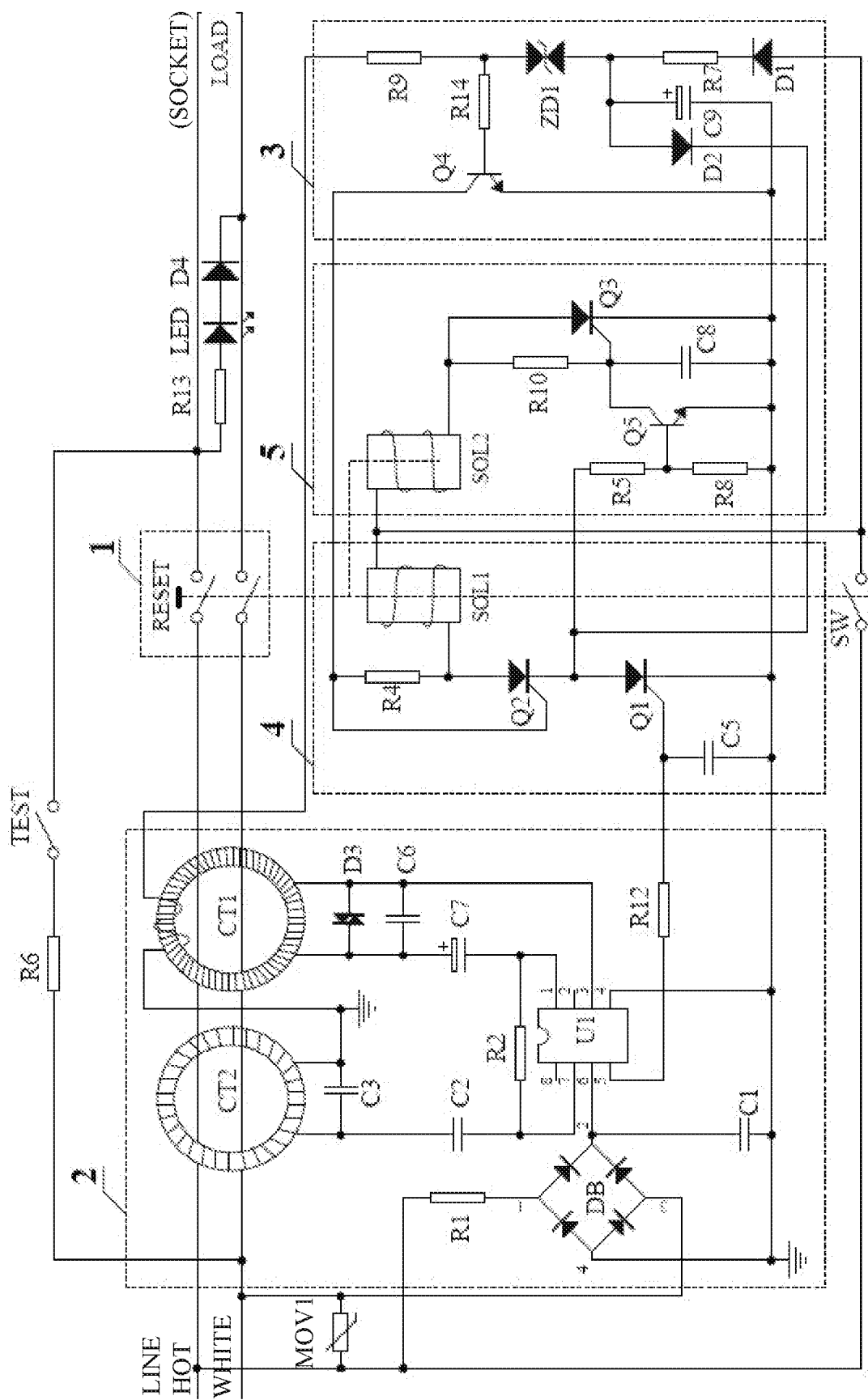
FIG. 3 is a circuit diagram of a leakage current detection and interruption device according to a third embodiment of the present invention.

FIG. 3 is a circuit diagram of a leakage current detection and interruption device according to a third embodiment of the present invention. Compared to the first embodiment of FIG. 1, a main difference is that the in the embodiment of FIG. 3, the output end has only a socket output (SOCKET), without a directly connected electrical load. When resetting such a device, there is no need to provide a first contact switch SW1 and to close it in order to drive the first solenoid SOL1 to unlock the reset switch RESET (i.e., resetting is directly accomplished by the manual action only). Further, in the third embodiment, a second switch SW is coupled between the input end LINE of the power supply lines and the leakage-responsive drive module 4, where the second switch SW is controlled by the first solenoid SOL1 and the second solenoid SOL2. When the leakage current detection module 2 detects a leakage current, the solenoid SOL1 and/or SOL2 drives the second switch SW to open, which can prevent the solenoids from burn out. The working principles of the third embodiment are similar to those of the first embodiment and detailed descriptions are omitted here.

Fourth Embodiment

Figure 4:
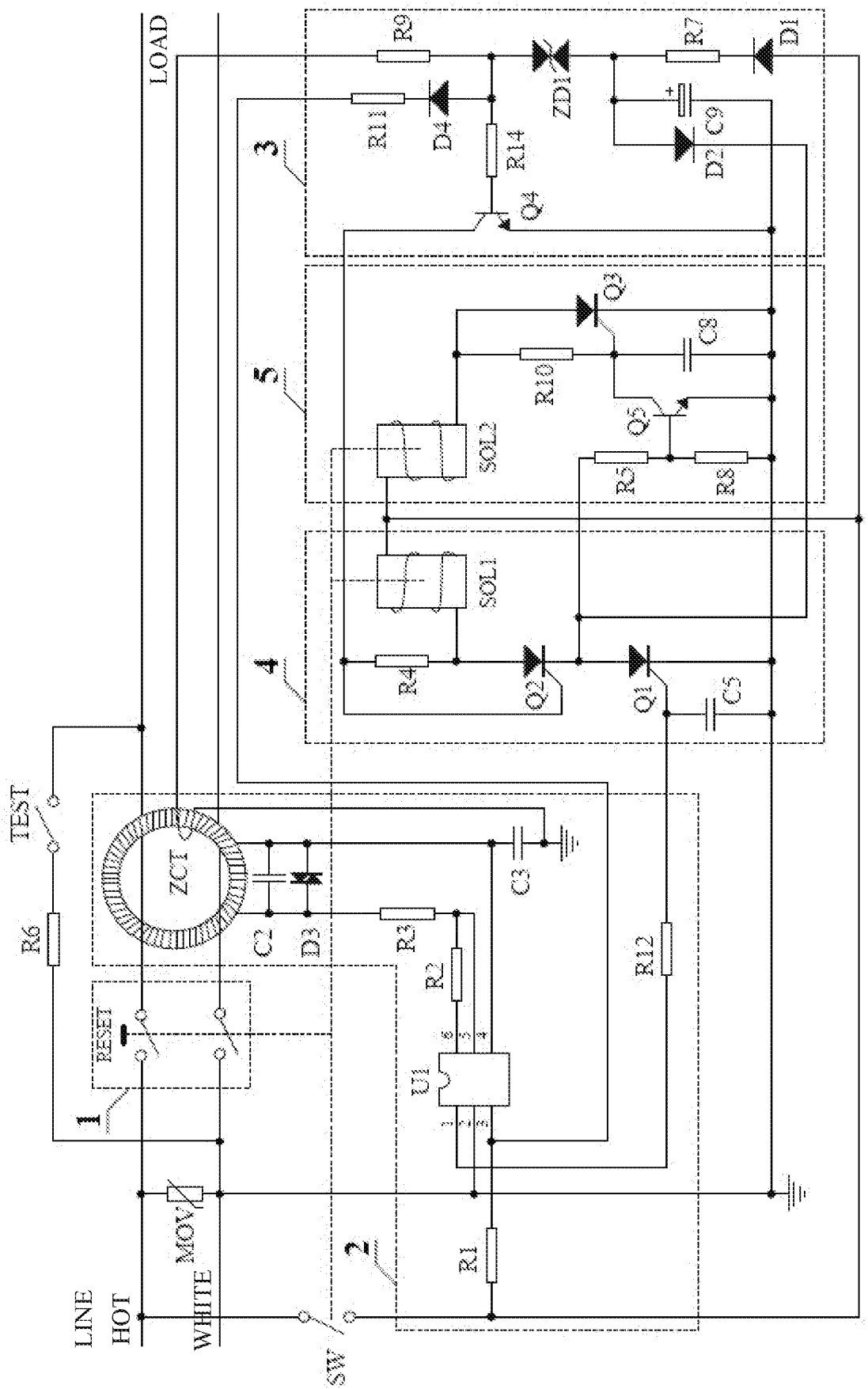
FIG. 4 is a circuit diagram of a leakage current detection and interruption device according to a fourth embodiment of the present invention.

FIG. 4 is a circuit diagram of a leakage current detection and interruption device according to a fourth embodiment of the present invention. This device is suitable as an appliance leakage-current interrupter (ALCI). Compared to the first embodiment of FIG. 1, the device in the fourth embodiment does not have neutral line protection, and uses a half-bridge rectifier (diode D4 and resistor R11) instead of a full-bridge rectifier. Further, like in the third embodiment, the first contact switch SW1 is not needed, and direct manual reset is possible. During the AC half-cycle when the leakage current detection unit U1 is not operating, a current flowing through the path ZD1-D4-R11 to supply power to the leakage current detection unit U1, enabling it to function normally to process the leakage current signal. The working principles of the fourth embodiment are similar to those of the first embodiment and detailed descriptions are omitted here.

Fifth Embodiment

Figure 5:
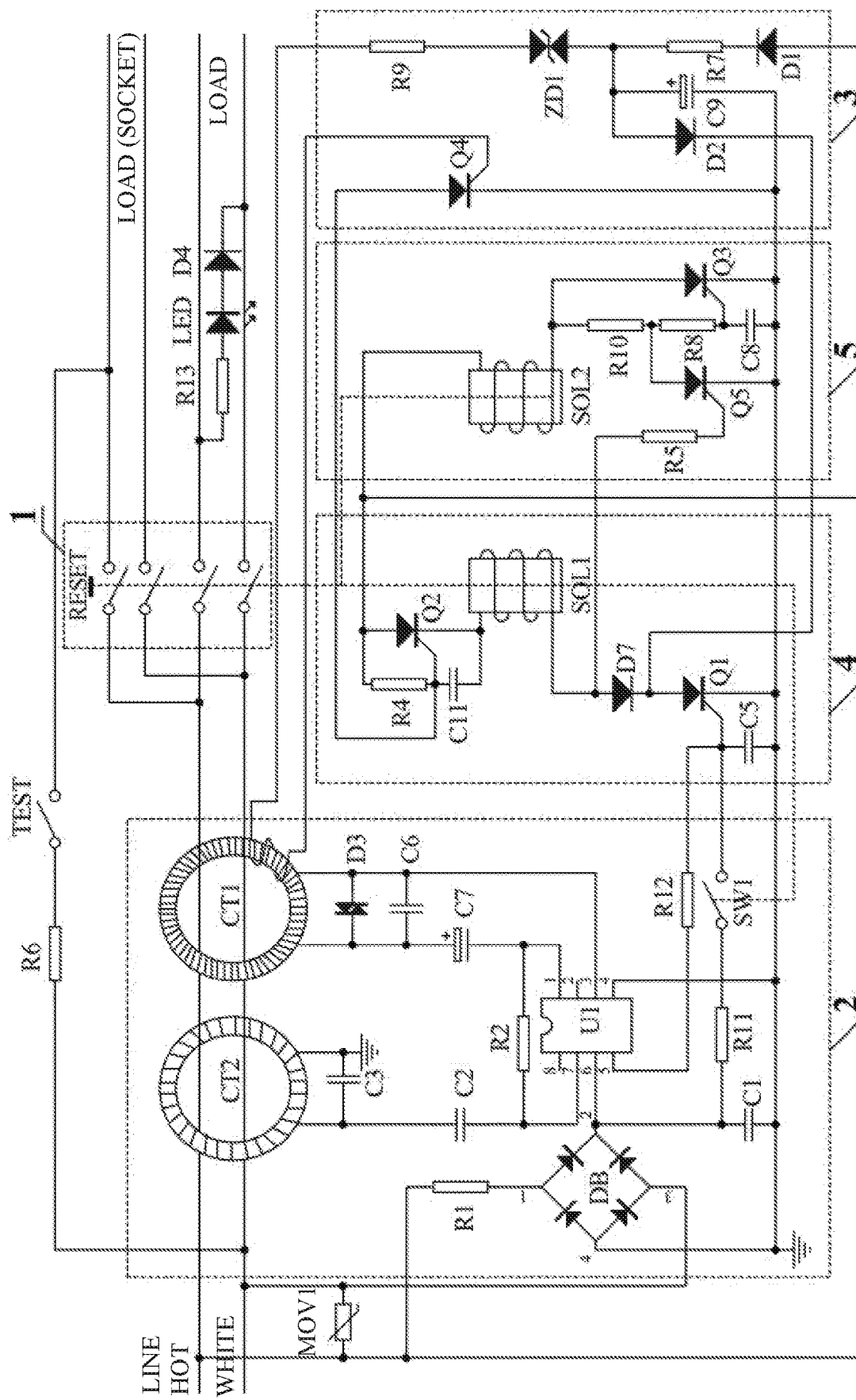
FIG. 5 is a circuit diagram of a leakage current detection and interruption device according to a fifth embodiment of the present invention.

FIG. 5 is a circuit diagram of a leakage current detection and interruption device according to a fifth embodiment of the present invention. Compared to the first embodiment of FIG. 1, a main difference is that the in the fifth embodiment of FIG. 5, the second semiconductor switch Q2 (e.g., an SCR) has its input end coupled to the input end LINE of the power supply lines, and its output end coupled to the first solenoid SOL1. Further, in the fifth embodiment, the fourth semiconductor switch Q5 and the fifth semiconductor switch Q4 are SCRs. The current path for the simulated current (self-test signal) is ZD1-R9-CT1-Q4-ground. The working principles of the fifth embodiment are similar to those of the first embodiment and detailed descriptions are omitted here.

Sixth Embodiment

Figure 6:
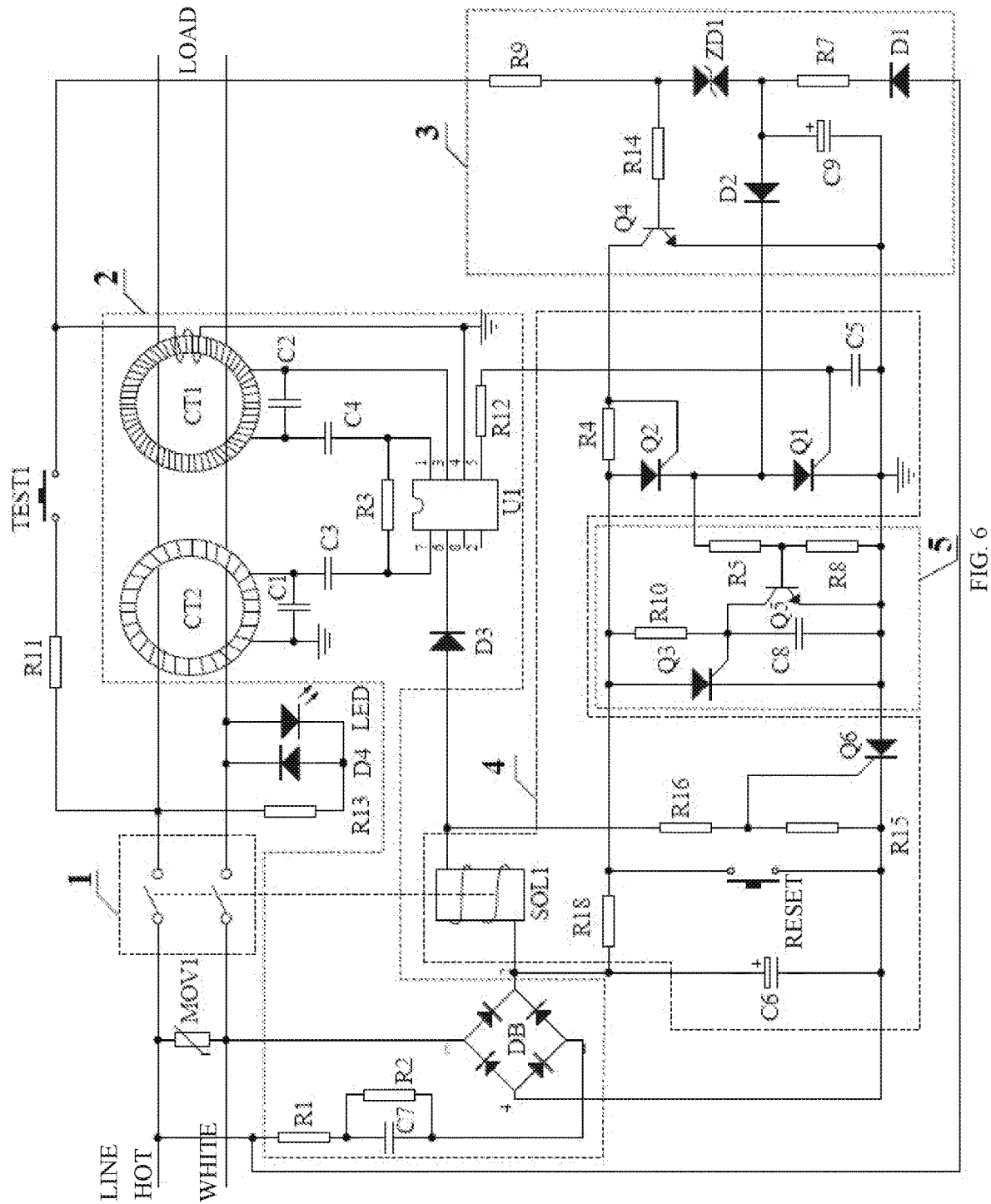
FIG. 6 is a circuit diagram of a leakage current detection and interruption device according to a sixth embodiment of the present invention.

FIG. 6 is a circuit diagram of a leakage current detection and interruption device according to a sixth embodiment of the present invention. As shown in FIG. 6, the leakage current detection and interruption device includes a switch module 1, a leakage current detection module 2, a leakage-responsive drive module 4, a fault-responsive drive module 5, and a self-test module 3.

The power supply lines include hot and white lines. The switch module 1 includes a reset switch coupled between the input end LINE and output end LOAD of the power supply lines, configured to control the electrical connection between the input end and the output end.

The leakage current detection module 2 includes: a neutral detection coil CT2, a leakage current detection coil CT1, a leakage current detection unit (processor chip) U1, a diode bridge (rectifier) DB, resistor R1, capacitor C7, and various other related resistors and capacitors. The leakage current detection coil CT1 detects any leakage current on the two power supply lines HOT and WHITE and outputs a signal to the leakage current detection unit U1. The leakage current detection unit U1 generates a leakage fault signal in response thereto. The diode bridge DB is coupled to the leakage-responsive drive module 4, second power line WHITE, ground, and the first power line HOT via resistor R1 and capacitor C7.

The leakage-responsive drive module 4 includes: first solenoid SOL1, second semiconductor switch Q2 (e.g., an SCR), first semiconductor switch Q1 (e.g., an SCR), fourth semiconductor switch Q6 (e.g., an SCR), capacitor C6 and first resistor R18. The first solenoid SOL1 is coupled to the diode bridge DB and the leakage current detection unit U1, and is configured to generate an electromagnetic force that drives the switch in the switch module 1. In this embodiment, the input end of the second semiconductor switch Q2 is coupled via resistor R18 to the first solenoid SOL1 and the diode bridge DB, its control electrode is coupled to the self-test module 3, and its output end is coupled to the input end of the first semiconductor switch Q1. The control electrode of the first semiconductor switch Q1 is coupled to an output of the leakage current detection unit U1, and its output end is coupled via the fault-responsive drive module 5 to the input end of the fourth semiconductor switch Q6. The output end of the fourth semiconductor switch Q6 is coupled to the first solenoid SOL1 and the diode bridge DB, and its control electrode is coupled to the leakage current detection unit U1 via resistor R16. Capacitor C6 is coupled between the output end of the fourth semiconductor switch Q6 and resistor R18.

The fault-responsive drive module 5 includes: a third semiconductor switch Q3 (e.g., an SCR), a fifth semiconductor switch Q5 (e.g., a transistor), a capacitor C8, and resistors R5, R8 and R10. The base of the fifth semiconductor switch Q5 is coupled via resistor R5 to a point between the first semiconductor switch Q1 and the second semiconductor switch Q2; its emitter is coupled to the input end of the fourth semiconductor switch Q6; and its collector is coupled to the control electrode of the third semiconductor switch Q3. The input end of the third semiconductor switch Q3 is coupled to the input end of the second semiconductor switch Q2, and its output end is coupled to the input end of the fourth semiconductor switch Q6. Capacitor C8 is coupled the control electrode of the third semiconductor switch Q3 and the input end of the fourth semiconductor switch Q6. Resistor R10 is coupled between the control electrode of the third semiconductor switch Q3 and the input end the second semiconductor switch Q2.

The self-test module 3 is similar to the self-test module 3 of the first embodiment of FIG. 1 and its detailed descriptions are omitted here.

The working principles of the leakage current detection and interruption device of this embodiment are as follows.

When the leakage current detection and interruption device is functioning normally, a current flows through the path HOT-R1-C7-DB to charge capacitor C6. The voltage across capacitor C6 is divided by the first solenoid SOL1, R16 and R15. When the voltage across resistor R15 reaches the trigger voltage of the fourth semiconductor switch Q6, the fourth semiconductor switch Q6 becomes conductive, so that a current flows through the path HOT-R1-C7-DB-SOL1-D3-U1-Q6-DB-WHITE. This current energizes the first solenoid SOL1, which generate an electromagnetic force to drive the switch module 1 to connect the power from the input end LINE to the output end LOAD.

When no leakage current is present on the power supply lines, the leakage current detection unit U1 will not generate a leakage fault signal, so the first semiconductor switch Q1 is non-conductive. Thus, a current flows through the path Q2-R5 to trigger the fourth semiconductor switch Q5 to be conductive. As a result, the control electrode of the third semiconductor switch Q3 is at a low voltage, i.e., the third semiconductor switch Q3 is non-conductive. Because the first semiconductor switch Q1 and third semiconductor switch Q3 are non-conductive, the first solenoid SOL1 has a sufficiently high current through it to maintain the switch module 1 in the closed state (i.e. not tripped).

During the self-testing of the device, a current flows through the path HOT-D1-R7 to charge capacitor C9. When the voltage across capacitor C9 reaches the trigger voltage of the Zener diode ZD1, the Zener diode ZD1 becomes conductive, causing a current to flow through R9-CT1-WHITE to generate a self-test signal (a simulated leakage current). The self-test signal is collected by the leakage current detection coil CT1 and processed by the leakage current detection unit U1 to generate a leakage current fault signal, which triggers the first semiconductor switch Q1 to become conductive. While the Zener diode ZD1 is conductive, the semiconductor switch Q4 of the self-test module 3 is triggered via resistor R14 to be conductive, so that the control electrode of the second semiconductor switch Q2 is at a low voltage. In other words, while the first semiconductor switch Q1 is conductive, the second semiconductor switch Q2 is non-conductive, so a current continues to flow through the first solenoid SOL1. In this state, capacitor C9 is discharged via D2-Q1, so the Zener diode ZD1 is off, causing the second semiconductor switch Q2 to become conductive again.

When the second semiconductor switch Q2 is non-conductive, no current flows through resistor R5, so the fifth semiconductor switch Q5 is non-conductive. In this state, resistor R10 charges capacitor C8. In this embodiment, the parameters of resistor R10 and capacitor C8 are adjusted so that the third semiconductor switch Q3 only becomes conductive after a predetermined time period T1, but the second semiconductor switch Q2 becomes conductive within the predetermined time period T1. Thus, after the second semiconductor switch Q2 becomes conductive again, the fourth semiconductor switch Q5 is triggered via R5 to be conductive again. As a result, capacitor C8 is discharged, and the control electrode of the third semiconductor switch Q3 is maintained at a low voltage, so the third semiconductor switch Q3 remains non-conductive.

On the other hand, after the self-test module 3 generates the self-test signal, if the leakage current detection coil CT1 or the leakage current detection unit U1 has a fault, the leakage current detection module 2 cannot generate a leakage current fault signal, then the first semiconductor switch Q1 remains non-conductive. When the first semiconductor switch Q1 is non-conductive, or the first semiconductor switch Q1 itself has an open-circuit fault, capacitor C9 cannot be discharged, so the Zener diode ZD1 remains triggered and conductive for a time period longer than the predetermined time period T1. Therefore, the semiconductor switch Q4 becomes conductive, which causes the second semiconductor switch Q2 and the fifth semiconductor switch Q5 to be non-conductive. In this state, resistor R10 continuously charges capacitor C8, and after the predetermined time period T1, the voltage across capacitor C8 triggers the third semiconductor switch Q3 to become conductive. As a result, a current flows through the path R18-Q3-Q6-DB to WHITE, so that the current flowing through first solenoid SOL1 drops to a low level (e.g., below a threshold current level) that is not sufficient to keep the switch module 1 in the closed state. Therefore, the switch module 1 trips and disconnects the power supply from the input end LINE to the output end LOAD.

Further, when the second semiconductor switch Q2 has an open-circuit fault, no current flows through resistor R5, so the fifth semiconductor switch Q5 remains non-conductive. Thus, resistor R10 continuously charges capacitor C8, and after the predetermined time period T1, the voltage across capacitor C8 triggers the third semiconductor switch Q3 to become conductive. As a result, the current flowing through first solenoid SOL1 drops to a low level (e.g., below the threshold current level) that is not sufficient to keep the switch module 1 in the closed state, causing the switch module 1 to trip and disconnect the power supply from the input end LINE to the output end LOAD.

In the above-described embodiments, the various semiconductor switches may be transistors, MOSFETs (metal-oxide-semiconductor field-effect transistors), SCRs, photo-couplers, or any other suitable switch devices (e.g., relays).

In the embodiments of FIGS. 1-5, the coils of the first and second solenoids may be wound around separate magnetic cores as shown in the drawings, or around a common magnetic core (not shown in the drawings).

The leakage current detection and interruption device according to the above embodiments of the present invention can not only achieve leakage current detection and interruption with a self-test function, but also trip and disconnect power when certain of its internal components (e.g., the solenoid that controls the switch module, semiconductor switches, etc.) are faulty. This ensures that the device disconnects power immediately upon occurrence of a fault condition in its internal components. This eliminates hidden safety threats and improves safety of the device.

Additional embodiments of the present invention provide an electrical power connection device, which includes a body and a leakage current detection and interruption device according to any one of the above embodiments disposed inside the body.

Other additional embodiments of the present invention provide an electrical appliance, which includes an electrical load, and an electrical power connection device coupled between a power supply and the load to supply power to the load, where the electrical power connection device employs a leakage current detection and interruption device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

What is claimed is:

1. A leakage current detection and interruption device comprising:
   power supply lines having an input end and an output end;
   a switch module coupled to the power supply lines between the input end and the output end, configured to control an electrical connection between the input end and the output end;
   a leakage current detection module, configured to detect a leakage current in the power supply lines and to generate a leakage fault signal in response thereto;
   a leakage-responsive drive module, coupled to the leakage current detection module and the switch module, configured to drive the switch module to disconnect the electrical connection between the input and output ends in response to the leakage fault signal;
   a fault-responsive drive module, configured to drive the switch module to disconnect the electrical connection between the input and output ends in response to a fault in the leakage-responsive drive module regardless of whether a leakage current is detected and regardless of whether a fault is present in the leakage current detection module; and
   a self-test module, coupled to the leakage current detection module and the leakage-responsive drive module, configured to generate a self-test signal, and to generate a self-test fault signal in response to a fault in the leakage current detection module and/or the leakage-responsive drive module.

2. The leakage current detection and interruption device of claim 1, wherein the leakage-responsive drive module includes:

a first solenoid, coupled to the switch module, configured to generate an electromagnetic force to drive the switch module;

a second semiconductor switch, coupled to the first solenoid, the self-test module and the fault-responsive drive module; and a first semiconductor switch, coupled to the leakage current detection module, and to either the second semiconductor switch or the first solenoid.

3. The leakage current detection and interruption device of claim 2, wherein the fault-responsive drive module includes:

a second solenoid, coupled to the switch module, configured to generate an electromagnetic force to drive the switch module; and a third semiconductor switch, coupled to the second solenoid, wherein in response to the fault in the leakage-responsive drive module and/or the leakage current detection module, the third semiconductor switch is configured to become conductive, whereby the second solenoid drives the switch module to disconnect the electrical connection between the input and output ends.

4. The leakage current detection and interruption device of claim 1, wherein in absence of any fault, the second semiconductor switch is non-conductive when the self-test module generates the self-test signal.

5. The leakage current detection and interruption device of claim 1, wherein the leakage current detection module includes:

a leakage current detection coil, wherein the power supply lines include at least a first power supply line and a second power supply line which pass through the leakage current detection coil, wherein the leakage current detection coil is configured to generate a leakage current signal in response to a leakage current on the first or second power supply line; and a leakage current detection unit, coupled to the leakage current detection coil and the leakage-responsive drive module, and configured to receive the leakage current signal and generate a leakage fault signal in response thereto.

6. The leakage current detection and interruption device of claim 5, wherein the self-test module is coupled to the leakage current detection coil, wherein the leakage current detection coil is configured to receive the self-test signal and feed it to the leakage current detection unit.

7. The leakage current detection and interruption device of claim 3, wherein each of the first, second and third semiconductor switch is a transistor, a metal-oxide-semiconductor field-effect transistor (MOSFET), a silicon-controlled rectifier (SCR), a photocoupler, or a relay.

8. The leakage current detection and interruption device of claim 1, further comprising:

a contact switch, coupled between the leakage-responsive drive module and the leakage current detection module, wherein in absence of any fault, the first contact switch is configured to control the leakage-responsive drive module to drive the switch module to connect the electrical connection between the input end and the output end.

9. The leakage current detection and interruption device of claim 1, further comprising:

a switch, coupled between the input end of the power supply lines and the leakage-responsive drive module, wherein the leakage-responsive drive module is configured to control the switch to disconnect the leakage-responsive drive module from the input end of the power supply lines in response to a leakage current on the power supply lines.

10. The leakage current detection and interruption device of claim 3, wherein the first and second solenoids include two coils wound around separate magnetic cores, or around a common magnetic core.

11. An electrical power connection device, comprising:
a body; and
the leakage current detection and interruption device of claim 1, disposed inside the body.

12. An electrical appliance, comprising:
an electrical load; and
an electrical power connection device coupled between a power supply and the load to supply power to the load, wherein the electrical power connection device includes the leakage current detection and interruption device of claim 1.

13. A leakage current detection and interruption device comprising:

power supply lines having an input end and an output end;
a switch module coupled to the power supply lines between the input end and the output end, configured to control electrical connection between the input end and the output end;

a leakage current detection module, configured to detect a leakage current in the power supply lines and to generate a leakage fault signal in response thereto;

a leakage-responsive drive module, coupled to the leakage current detection module and the switch module, configured to drive the switch module to disconnect the electrical connection between the input end and the output end in response to the leakage fault signal;

a fault-responsive drive module, including:
a second solenoid, coupled to the switch module, configured to generate an electromagnetic force to drive the switch module; and
a third semiconductor switch, coupled to the second solenoid,
wherein in response to a fault in the leakage-responsive drive module regardless of whether a leakage current is detected and regardless of whether a fault is present in the leakage current detection module, the third semiconductor switch is configured to become conductive, whereby the second solenoid drives the switch module to disconnect the electrical connection between the input end and the output end; and a self-test module, coupled to the leakage current detection module and the leakage-responsive drive module, configured to generate a self-test signal, and to generate a self-test fault signal in response to the fault in the leakage current detection module and/or the leakage-responsive drive module.

14. The leakage current detection and interruption device of claim 13, wherein the leakage-responsive drive module includes:

a first solenoid, coupled to the switch module, configured to generate an electromagnetic force to drive the switch module;

a second semiconductor switch, coupled to the first solenoid, the self-test module and the fault-responsive drive module; and a first semiconductor switch, coupled to the leakage current detection module, and to either the second semiconductor switch or the first solenoid.

15. The leakage current detection and interruption device of claim 13, wherein in absence of any fault, the second semiconductor switch is non-conductive when the self-test module generates the self-test signal.

16. The leakage current detection and interruption device of claim 13, wherein the leakage current detection module includes:
   a leakage current detection coil, wherein the power supply lines include at least a first power supply line and a second power supply line which pass through the leakage current detection coil, wherein the leakage current detection coil is configured to generate a leakage current signal in response to a leakage current on the first or second power supply line; and
   a leakage current detection unit, coupled to the leakage current detection coil and the leakage-responsive drive module, and configured to receive the leakage current signal and generate a leakage fault signal in response thereto.

17. The leakage current detection and interruption device of claim 16, wherein the self-test module is coupled to the leakage current detection coil, wherein the leakage current detection coil is configured to receive the self-test signal and feed it to the leakage current detection unit.

18. The leakage current detection and interruption device of claim 14, wherein each of the first, second and third semiconductor switch is a transistor, a metal-oxide-semiconductor field-effect transistor (MOSFET), a silicon-controlled rectifier (SCR), a photocoupler, or a relay.

19. The leakage current detection and interruption device of claim 13, further comprising:
   a contact switch, coupled between the leakage-responsive drive module and the leakage current detection module, wherein in absence of any fault, the first contact switch is configured to control the leakage-responsive drive module to drive the switch module to connect the electrical connection between the input end and the output end.

20. The leakage current detection and interruption device of claim 13, further comprising:
   a second switch, coupled between the input end of the power supply lines and the leakage-responsive drive module, wherein the leakage-responsive drive module is configured to control the second switch to disconnect the leakage-responsive drive module from the input end of the power supply lines in response to a leakage current on the power supply lines.

21. The leakage current detection and interruption device of claim 14, wherein the first and second solenoids include two coils wound around separate magnetic cores, or around a common magnetic core.

22. An electrical power connection device, comprising:
   a body; and
   the leakage current detection and interruption device of claim 13, disposed inside the body.

23. An electrical appliance, comprising:
   an electrical load; and
   an electrical power connection device coupled between a power supply and the load to supply power to the load, wherein the electrical power connection device includes the leakage current detection and interruption device of claim 13.

* * * * *